United States Patent
Hatcher et al.

(10) Patent No.: US 9,431,529 B2
(45) Date of Patent: Aug. 30, 2016

(54) CONFINED SEMI-METAL FIELD EFFECT TRANSISTOR

(71) Applicant: Samsung Electronics Co., Ltd., Gyeonggi-do (KR)

(72) Inventors: Ryan M. Hatcher, Round Rock, TX (US); Jorge A. Kittl, Round Rock, TX (US); Robert C. Bowen, Austin, TX (US)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/625,376

(22) Filed: Feb. 18, 2015

(65) Prior Publication Data
US 2016/0071970 A1 Mar. 10, 2016

Related U.S. Application Data

(60) Provisional application No. 62/047,221, filed on Sep. 8, 2014.

(51) Int. Cl.
| | |
|---|---|
| *H01L 29/745* | (2006.01) |
| *H01L 29/74* | (2006.01) |
| *H01L 29/768* | (2006.01) |
| *H01L 27/095* | (2006.01) |
| *H01L 21/335* | (2006.01) |
| *H01L 29/78* | (2006.01) |
| *H01L 29/66* | (2006.01) |
| *H01L 29/06* | (2006.01) |

(52) U.S. Cl.
CPC .......... *H01L 29/78* (2013.01); *H01L 29/0669* (2013.01); *H01L 29/66477* (2013.01)

(58) Field of Classification Search
CPC .......... H01L 29/785; H01L 27/14887; H01L 27/14831; H01L 29/47; H01L 29/1062; H01L 29/76833; H01L 29/76866; H01L 29/872; H01L 29/66143; H01L 21/00
USPC ......... 438/142, 152–154, 471, 476; 257/213, 257/223, 224, 229, 243, 471, 485
See application file for complete search history.

(56) References Cited

U.S. PATENT DOCUMENTS

| | | | |
|---|---|---|---|
| 7,560,351 B2 | 7/2009 | Hofmann et al. | |
| 8,247,806 B2 * | 8/2012 | Chae | H01L 29/0673 257/40 |
| 8,547,728 B2 | 10/2013 | Lin et al. | |
| 2014/0097403 A1 * | 4/2014 | Heo | H01L 29/7391 257/27 |

FOREIGN PATENT DOCUMENTS

EP 0093971 8/1990

* cited by examiner

*Primary Examiner* — Hsien Ming Lee
(74) *Attorney, Agent, or Firm* — Convergent Law Group LLP

(57) ABSTRACT

Exemplary embodiments are disclosed for a semi-metal transistor, comprising: a semi-metal contact region adjacent to a metal contact; at least one semiconductor terminal; and a semi-metal transition region connected between the contact region and the semiconductor terminal that transitions from a substantially zero gap semi-metal beginning at an interface of the contact region into a semiconductor with an energy band gap towards the semiconductor terminal.

24 Claims, 7 Drawing Sheets

Off State

On State

CONFINED SEMI-METAL FIELD EFFECT TRANSISTOR

CROSS-REFERENCE TO RELATED APPLICATIONS

This application claims the benefit of Provisional Patent Application Ser. No. 62/047,221, entitled "Confined Semi-metal Field Effect Transistor" filed Sep. 8, 2014, the contents which are herein incorporated by reference.

BACKGROUND

Transistor performance in advanced nodes is increasingly limited by the contact resistance between the source/drain and the metal leading to the interconnect layers. For most metal/semiconductor interfaces, the contact resistance is dominated by the Schottky Barrier (SB) that forms at the interface. There have been several strategies to reduce the contact resistance by reducing the SB—e.g. reacted metals (silicides), workfunction tuning of the metal, Metal-Insulator-Semiconductor (MIS) structures, and the like.

These strategies have resulted in varying degrees of success. The fundamental problem with all of these approaches is there remains an abrupt interface between a material with an electronic energy gap and a metal. States with energies that are forbidden in bulk exist near the surface of materials with electronic energy gaps. Depending on the energy distribution of these states, dipoles form, which are responsible for SBs. The best reported values for interface contact resistivities are in the 10-9 ohm-cm2 range, and it is believed that for abrupt semiconductor-metal interfaces there is a fundamental limit to achieving ultra-low contact resistivities, so that the lowest values achievable (even in the absence of a SB) are in the 10E-10 ohm-cm2 range. Scaling dictates a factor of 2 decrease in feature area per node. Even with clever approaches to increase the effective contact area, the metal-semiconductor contact resistance will become the main limit to performance at a 3 nm node and beyond.

It would be desirable for a method and system that eliminate the large contribution of the abrupt metal/semiconductor interface to parasitic resistance, enabling further scaling without the performance penalties due to large contact resistance.

BRIEF SUMMARY

The exemplary embodiment provides methods and systems for a semi-metal transistor, comprising: a semi-metal contact region adjacent to a metal contact; at least one semiconductor terminal; and a semi-metal transition region connected between the contact region and the semiconductor terminal that transitions from a substantially zero gap semi-metal beginning at an interface of the contact region into a semiconductor with an energy band gap towards the semiconductor terminal.

BRIEF DESCRIPTION OF SEVERAL VIEWS OF THE DRAWINGS

These and/or other features and utilities of the present general inventive concept will become apparent and more readily appreciated from the following description of the embodiments, taken in conjunction with the accompanying drawings of which.

DETAILED DESCRIPTION

Figure 1A:
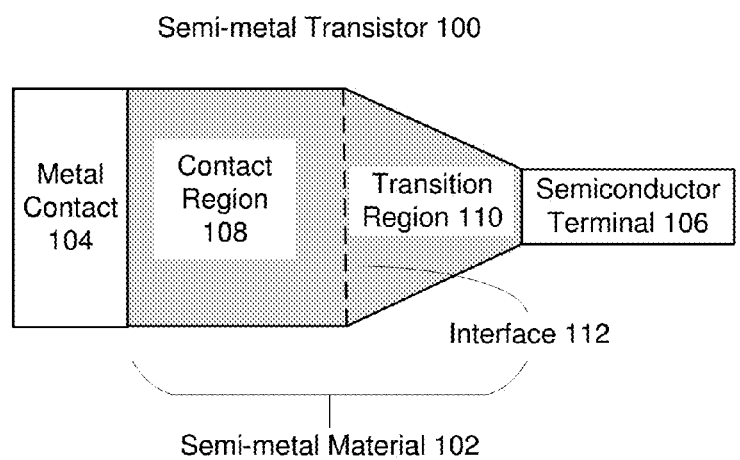
FIGS. 1A and 1B are block diagrams illustrating a portion of a semi-metal transistor structure, and more specifically a semi-metal field effect (FET) transistor, according to an exemplary embodiment.

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures.

Advantages and features of the present invention and methods of accomplishing the same may be understood more readily by reference to the following detailed description of embodiments and the accompanying drawings. The present general inventive concept may, however, be embodied in many different forms and should not be construed as being limited to the embodiments set forth herein. Rather, these embodiments are provided so that this disclosure will be thorough and complete and will fully convey the concept of the general inventive concept to those skilled in the art, and the present general inventive concept will only be defined by the appended claims. In the drawings, the thickness of layers and regions are exaggerated for clarity.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

The exemplary embodiments seek to minimize or eliminate the Schottky Barrier (SB) typically present when contact is made with a metal semiconductor terminal of a device, such as a source/drain of a MOS transistor, by smoothly transitioning from a substantially zero gap semi-metal at the interface of the semiconductor terminal and metal contact, to a semiconductor with an energy bandgap towards the device, thus avoiding the abrupt transition that exists at metal-semiconductor interfaces in conventional metal contacts to semiconductor terminals of electronic devices. The exemplary embodiments also eliminate additional sources of high interface contact resistivities that are typically present due to the abrupt changes in the electronic structure (e.g. change in effective mass, transverse momentum, etc. . . . ) that exist at sharp metal-semiconductor interfaces in prior art metal contacts to semiconductor terminals of devices.

Figure 1B:
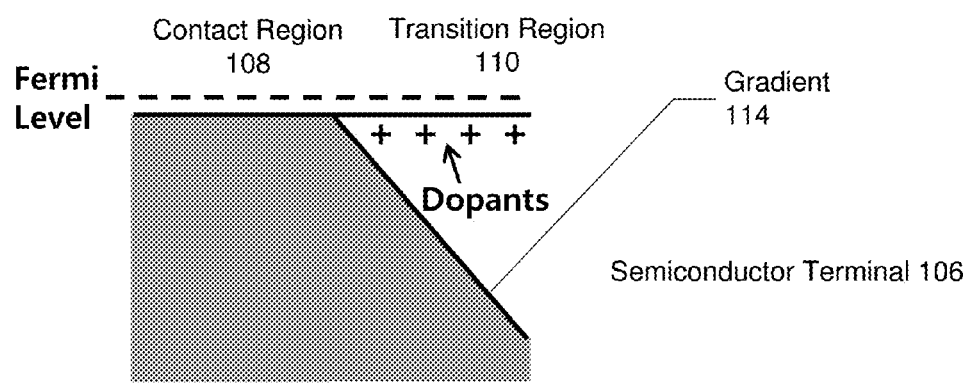

FIGS. 1A and 1B are block diagrams illustrating a portion of a semi-metal transistor structure, and more specifically a semi-metal field effect (FET) transistor, according to an exemplary embodiment. FIG. 1A is a top view of the portion of a semi-metal transistor and FIG. 1B is a side view showing an optional band structure of the semi-metal transistor. The semi-metal transistor 100 comprises a semi-metal material 102 in between a metal contact 104 and a metal semiconductor terminal 106 of the semi-metal transistor 100. The semi-metal material 102 includes a contact region 108 adjacent to the metal contact 104, and a transition region 110 connected between the contact region 108 and the semiconductor terminal 106 that transitions from a substantially zero gap semi-metal beginning at an interface 112 of the contact region 108 into a semiconductor with an energy band gap towards the metal semiconductor terminal 106.

The semi-metal material 102 has substantially no intrinsic electronic gap in bulk but a gap can be induced due to geometric confinement. The dimensions of the contact region 108 between the metal contact 104 and the transition region 110 is such that there is no significant confinement for the semi-metal material 102 so that the band gap of the semi-metal material 102 is substantially zero in this region. Therefore, substantially no SB is formed at the interface of the contact region 108 and the metal contact 104. At the interface with the metal contact 104, the dimensions are sufficiently large so that the gap is zero or nearly zero and therefore a SB will not form.

In one embodiment, the semi-metal material 102 may be also used as the semiconductor terminal 106 of the device by confinement. In an alternative embodiment, the semi-metal material 102 may extend to the interface with the semiconductor terminal 106 of the device. In most applications, the semiconductor terminal of the device comprises the semi-metal whose band gap is opened by confinement. In some implementations, an interface with another semiconductor can be placed at the narrow end of the transition region 110, depending on the nature of the device.

The change in dimensions of the transition region 110 from the interface 112 with the contact region 108 towards the semiconductor terminal 106 or the channel (referred to as source/drain extension regions) are preferably smooth, i.e. without significant abrupt changes, to smoothly open an energy band gap by geometric confinement of the transition region 110. The dimensions of the semi-metal material 102 may be varied through the structure (or a portion of the structure) in the direction perpendicular or at an angle to the direction of current transport through the structure, such that a gap is opened steadily by distance through confinement as dimensions of the semi-metal material 102 are reduced over a distance that is generally greater than 3 nm and less than 100 nm, resulting in a semiconductor type gap (>200 meV) at the semiconductor terminal 106 of the device.

In the specific embodiment shown in FIG. 1A, the transition region 110 has dimensions that gradually reduce in width starting from the interface 112 with the contact region 108 towards the semiconductor terminal 106 to open a gap by confinement. Thus, the exemplary embodiments provide a transition region 110 in which the band gap is smoothly opened due to the width of the transition region 110 being gradually reduced from the substantially zero band gap at the interface 112 towards the semiconductor band gap in the device.

As shown in FIG. 1B, the transition region 110 may optionally further comprise a compositional gradient 114 to aid transition from a gapless semi-metal starting at the interface 112 with the contact region 108 to a semiconductor with a band gap towards the semiconductor terminal 106. In one embodiment, the transition region 110 are highly doped to provide low resistivity throughout, resulting in a low resistivity path from the metal to the semiconductor. Highly doped may comprise doping levels greater than $2\times10^{19}$ $cm^{-3}$, and in some embodiments greater than $1\times10^{30}$ $cm^{-3}$. Without high doping, the barrier that forms in the transition region near where the FL crosses the band edge won't be screened effectively, which in turn will lead to high resistance.

In some embodiments, a smooth compositional gradient may be used in combination with the gradual reduction in dimensions of the transition region 110 to change the band gap from substantially zero to a desired band gap at the semiconductor terminal 106.

The semi-metal transistor structure shown in FIGS. 1A and 1B provide a low resistivity path from the metal contact 104 to a gapped semiconductor terminal 106, and can be used in metal contacts to semiconductor terminals of devices. The present invention also provides low parasitic resistance due to ultra-low resistive metal/semi-metal contacts.

The exemplary embodiments can be used in contacts to n-type or p-type semiconductor terminals of devices. In the case of MOS transistors, the exemplary embodiments can be used for nMOS or pMOS transistors.

In one embodiment, a semi-metal material 102 is selected that has substantially 0 gap, i.e. gap <150 meV) in bulk form. The area and geometry of the contact region 108 may be sufficiently large so that the semi-metal material 102 has substantially 0 gap (<150 meV) at the interface with the metal contact 104. Sufficiently large means larger than or comparable to the characteristic confinement length of the semi-metal material 104 (dimension below which a gap starts to open due to quantum confinement).

The particular semi-metal material 104 used can be chosen for specific implementations. Example materials suitable for the semi-metal material 104 include alpha-Sn, Bi. Sb, Bi—Sb alloys, and the like. In the case of Bi—Sb alloys (as well as Bi or Sb), doping is possible to high levels (>1 E20 cm-3), n-type doping can be achieved by adding Te and p-type by adding Sn. For the case of Bi—Sb alloys, the confinement lengths can be quite large (>50 nm), so that device dimensions can be in this range which is easy accessible by known patterning techniques. If Sn is used as the semi-metal, alloying with Ge can be used in addition to varying the dimensions in order to help in opening the gap within the structure. A smooth change both in dimensions and composition is advised.

Figure 2A:
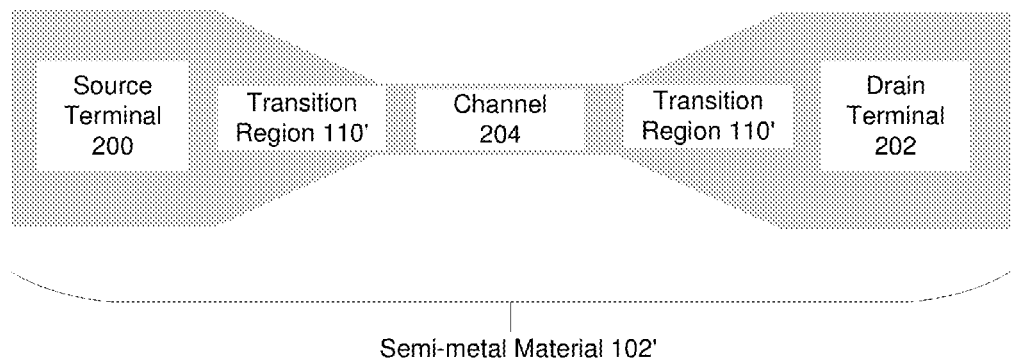
FIGS. 2A through 2C are block diagrams illustrating a portion of a semi-metal MOS transistor.
Figure 2B:
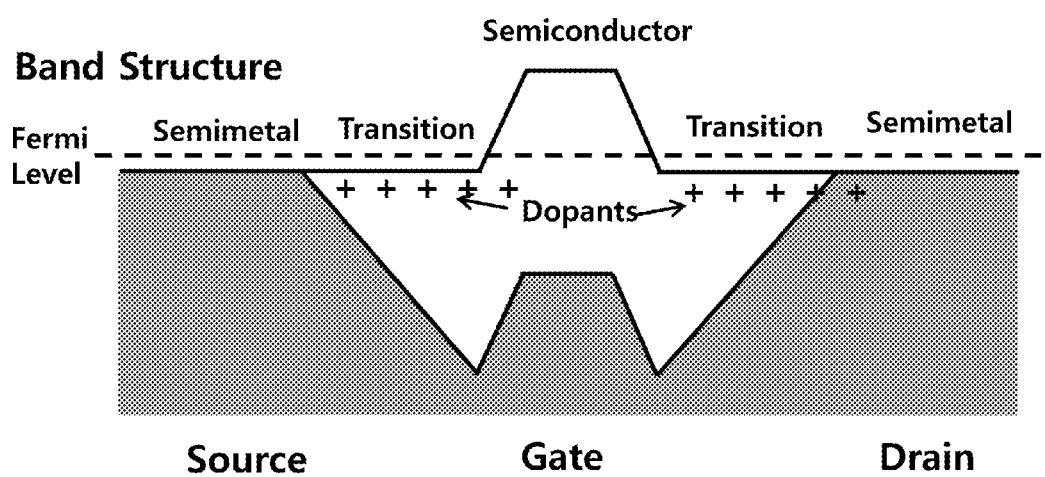
Figure 2C:
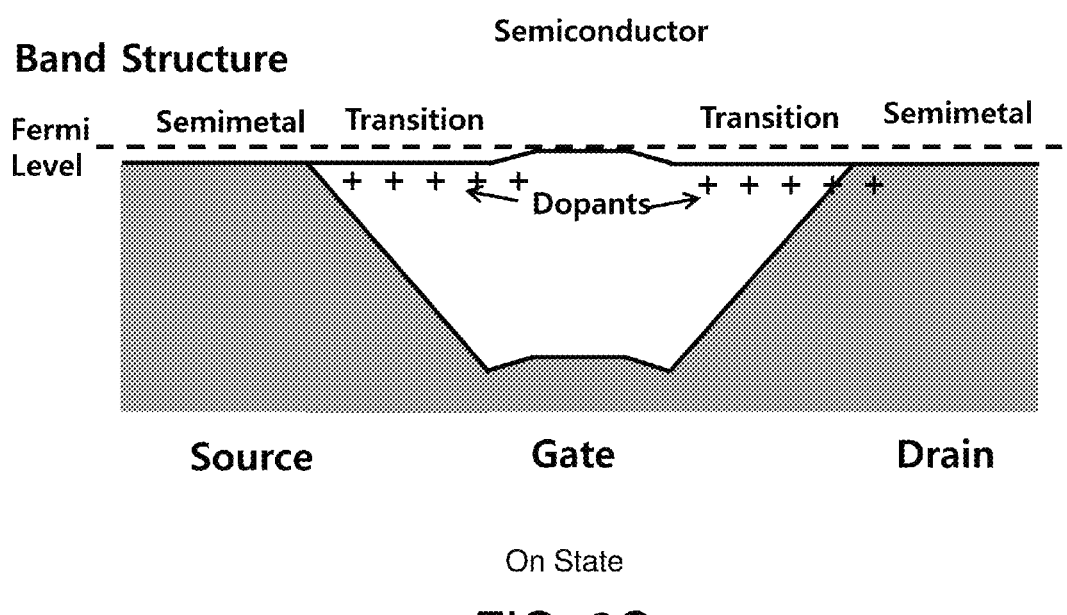

FIGS. 2A through 2C are block diagrams illustrating a portion of a semi-metal MOS transistor. FIG. 2A is a top view of the portion of the semi-metal MOS transistor and FIGS. 2B and 2C are side views showing a band structure of the semi-metal MOS transistor in Off and On states, respectively. In this embodiment, the semi-metal material 102' may be used to contact the source and the drain terminals 200 and 202 of the transistor. In one implementation, the semi-metal material 102' can be used for a channel 204 (also referred to as the gapped region), the source/drain transition regions 110' and the source/drain terminals 200 and 200 to of the MOS transistor. In the case of a MOS transistor in which the same semi-metal material is used as the channel 204 and the source/drain transition regions 110', the dimensions of the channel 204 may be chosen to create a gap that is large enough such that the MOS transistor can be placed in an off state.

Similar to what is shown in FIGS. 1A and 1B, dimensions of the transition regions 110' are gradually reduced from the source and drain terminals 200 and 202 towards the channel 204 to open a gap by confinement, and the semi-metal has no gap in the interface to the metal source and drain terminals 200 and 202.

As shown in FIG. 2B, some composition grading of the semi-metal material 102' may be used in the source and drain terminal 200 and 202 areas and/or transition regions 110'. The transition regions 110', in which the band gap is smoothly opened due to dimensions being gradually reduced, may be highly doped (n-type dopant for n-type device terminals and p-type dopants for p-type device terminals) in order to provide enough screening of the barrier that forms due to the spatial distribution of occupied states near the band edge, ensuring the Fermi level is kept within the corresponding band (conduction band for n-type terminals, valence band for p-type terminals) and to provide low resistivity. The device structure shown in FIGS. 2A and 2B provides a MOS FET device having ultra-low contact resistance between a metal and a semiconductor terminal of a device.

A key to the exemplary embodiments that conventionally is not proposed is to grade the dimensions of the semi-metal from the small dimensions that result in a gap at the channel towards large enough dimensions in the source/drain to eliminate the gap in order to make ultra-low resistance contacts. Stated differently, the semi-metal transistor of the exemplary embodiments incorporates a smooth transition in geometries to ensure a smooth/gradual change in band gap. Conventional devices have a significant contact resistance because they fail to eliminate the gap towards the metal contacts to have a contact resistance benefit. Conventional devices fail to use geometry to smoothly vary the electronic properties from channel to contact in order to achieve ultra low contact resistance, nor do they have a gradual change in geometry or of screening with dopants. One focus of the semi-metal transistor of the exemplary embodiments is achieving low contact resistivities between a metal and a semiconductor terminal of a device. Conventional devices do not benefit from ultra-low contact resistivity between a metal and a semiconductor terminal of a device. For non-semi-metal devices, one difference is the use of geometric confinement instead of composition to smoothly vary the electronic gap, and the choice in the exemplary embodiments of a semi-metal, rather than a low band gap semiconductor as the contacted material.

The exemplary embodiments may be applied for the contacts to MOS devices. In a specific embodiment, substantially the same semi-metal material can be used for the channel/gapped region and contact structures described above. The contact regions may take the role of SD and SD extensions of the MOS device. In the case of application to MOS devices, the semi-metal material may be configured into any specific geometry of the MOS devices, ranging from planar transistors, to FinFET, nanowire, nanosheet or a stacked nanosheet device transistor, with current flow in the channel in the vertical or horizontal direction (or any desired direction as designed).

In some embodiments, the change in band gap can be modulated both by a gradual change in dimensions as well as by a gradual change in composition. For example, in addition to the change in dimensions inducing a change in band gap by confinement, a gradual compositional change may be also included to further modulate the band gap. Thus, in this embodiment, the channel, extensions and SD areas may contain different materials. However, the rate of increase in the band gap as a function of distance is constant from one part of the device where it is zero to another part of the device where it is large enough to modulate current for MOSFET operation, i.e. there is at no point any significant abrupt change in band gap. The band gap is close to zero at the interface with the metal contacts. Confinement may be used to increase the band gap in the extensions and channel.

The above description is general, and many possible implementations can be envisioned, with different geometries and layouts, as well as fabrication techniques, as illustrated below.

FIGS. 3A-3B, 4A-4B, 5A-5B and 6 illustrate examples of different possible geometrical implementations of a semi-metal transistor structure. The examples focus in the application to MOS devices using substantially the same semi-metal material for the source, extensions, drain and channel. Similar ideas can be extended as application to realize low resistivity contact schemes to semiconductor terminals of any other devices that can benefit from a low resistivity contact to a semiconductor.

Figure 3A:
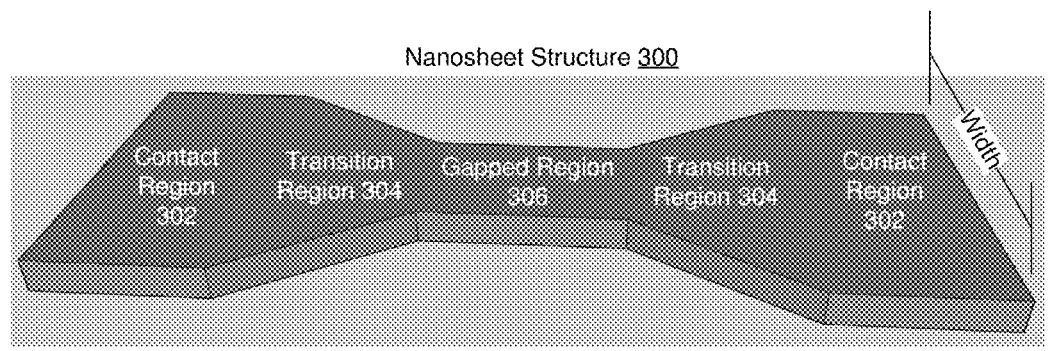
FIGS. 3A-3B are diagrams illustrating an implementation of a semi-metal nanosheet structure that induces a gap in the semiconducting region by confining dimensions of the nanosheet in the plane of the nanosheet.
Figure 3B:
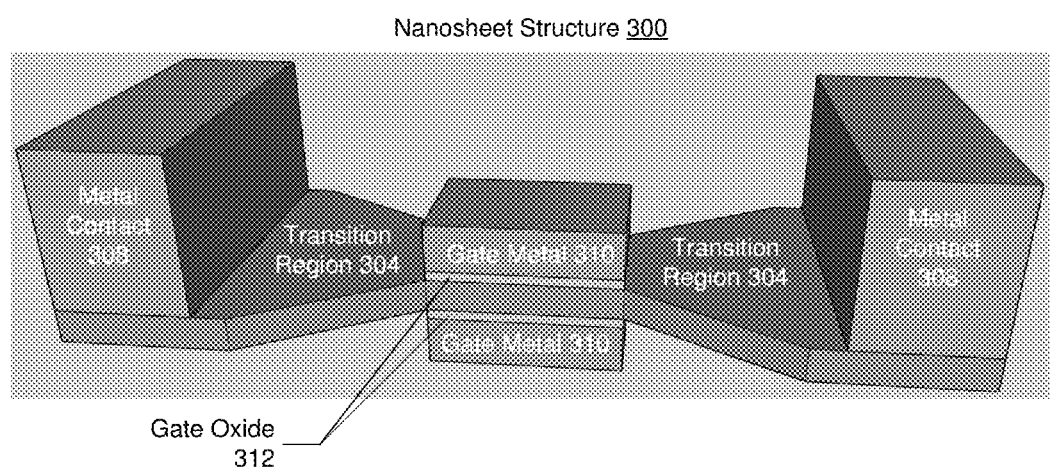

FIGS. 3A-3B are diagrams illustrating an implementation of a semi-metal nanosheet structure that induces a gap in the semiconducting region by confining dimensions of the nanosheet in the plane of the nanosheet. FIG. 3A shows a basic FET embodiment of the nanosheet structure 300 comprising a semi-metal material in bulk form having two contact regions 302 adjacent to respective transition regions 304 and a gated region in the middle referred to as the gapped region 306. FIG. 3A shows the nanosheet structure 300 with metal contacts 308 on the contact regions 302, and a stack of gate metal 310 and gate oxide 312 on both sides of the gapped region 306.

Current flow through the nanosheet structure 300 in the transition regions 304 that have varying dimensions can be substantially in the vertical direction (i.e. normal to the wafer surface, if the device is fabricated on a wafer), in the horizontal direction (i.e. parallel to the wafer surface), or in any other direction or combination of directions as designed. In some implementations, current flow may be in several directions throughout the structure.

If current flow is substantially horizontal, lithography and patterning techniques can be used to define the lateral dimensions of the nanosheet structure 300, providing transition regions 304 having smoothly varying widths, starting with a sufficiently large width that results in substantially zero gap at the interface with the metal contacts 308, to a sufficiently small width that opens a gap by geometric confinement near the gapped region 306. In this case, the metal/semi-metal interface of the transition region 304 can be a horizontal plane (i.e., with significant component of current flow at the metal-semi-metal interface being vertical).

Figure 4A:
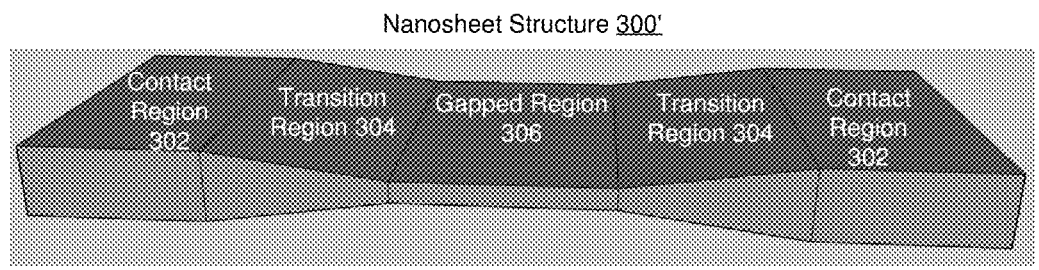
FIGS. 4A-4B are diagrams illustrating an implementation of a semi-metal nanosheet structure when current flow is substantially vertical.
Figure 4B:
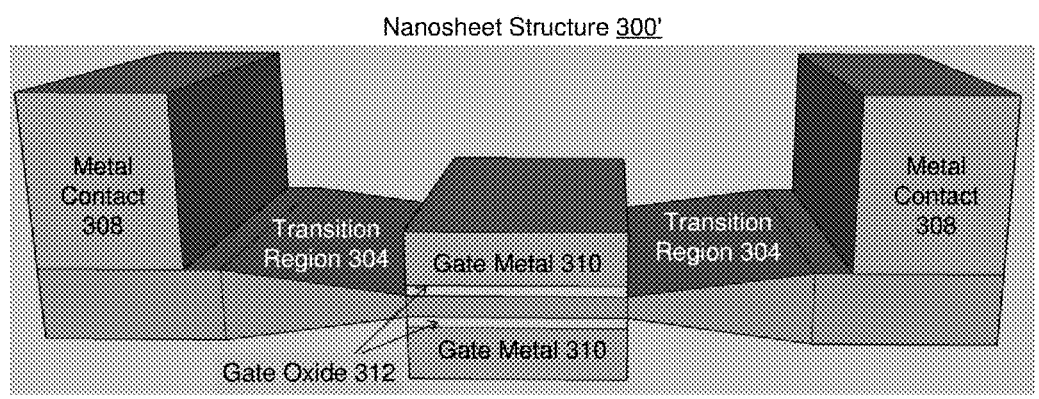

FIGS. 4A-4B are diagrams illustrating an implementation of a semi-metal nanosheet structure 300' when current flow is substantially vertical, where like components from FIGS. 3A-3B have like reference numerals. In this case, the change in dimensions of the transition regions 304 can be obtained by appropriate tapering techniques, such as etch processes that can result in tapered profiles. For example, the transition regions 304 may be etched or tapered so that dimensions of the transition region 304 are gradually reduced both in height and width starting from the interface with the contact region 302 towards the gapped region 306. This can be used in the direct patterning of the nanosheet structure 300', or to define the volume in which the structure will be grown.

Figure 5A:
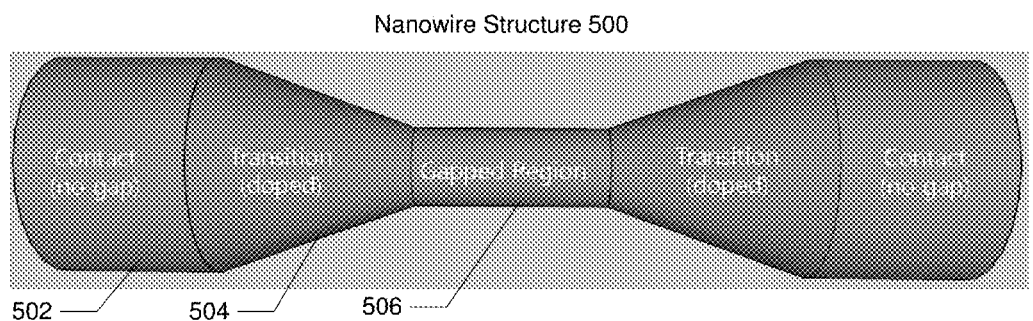
FIGS. 5A-5B are diagrams illustrating an implementation of a semi-metal FET nanowire structure according to a further embodiment.
Figure 5B:
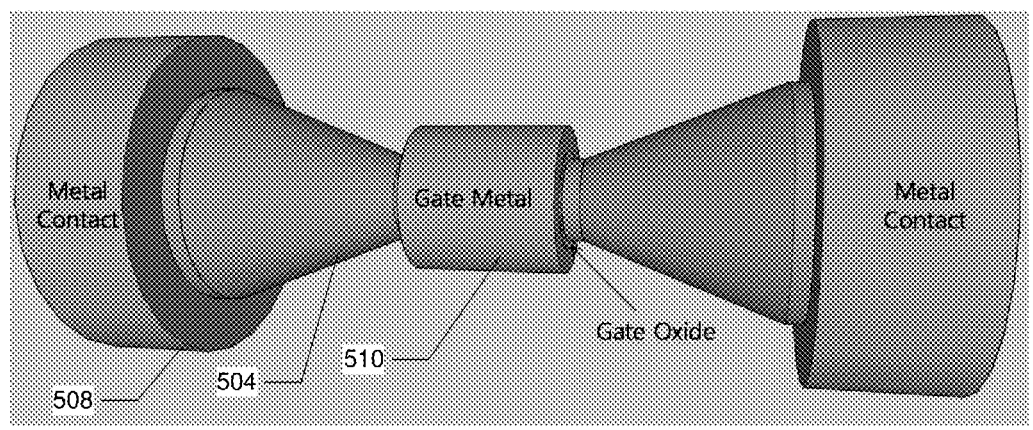

FIGS. 5A-5B are diagrams illustrating an implementation of a semi-metal FET nanowire structure according to a further embodiment. The nanowire structure 500 comprising a semi-metal material in bulk form having two contact regions 502 adjacent to respective transition regions 504 on either side of a gated or gapped region 506, where the contact region 502, the transition region 504 and the gapped region 506 have substantially a circular cross-section. The nanowire structure 500 induces a gap in the gapped region 506 by gradually confining the radius of the nanowire at the transition regions 504 starting at the interface with the contact regions 502 towards the gapped region 506. FIG. 5B shows the nanowire structure 500 with metal contacts 508 over the contact regions 502 and a gate metal 510 over the gapped region 506.

Figure 6:
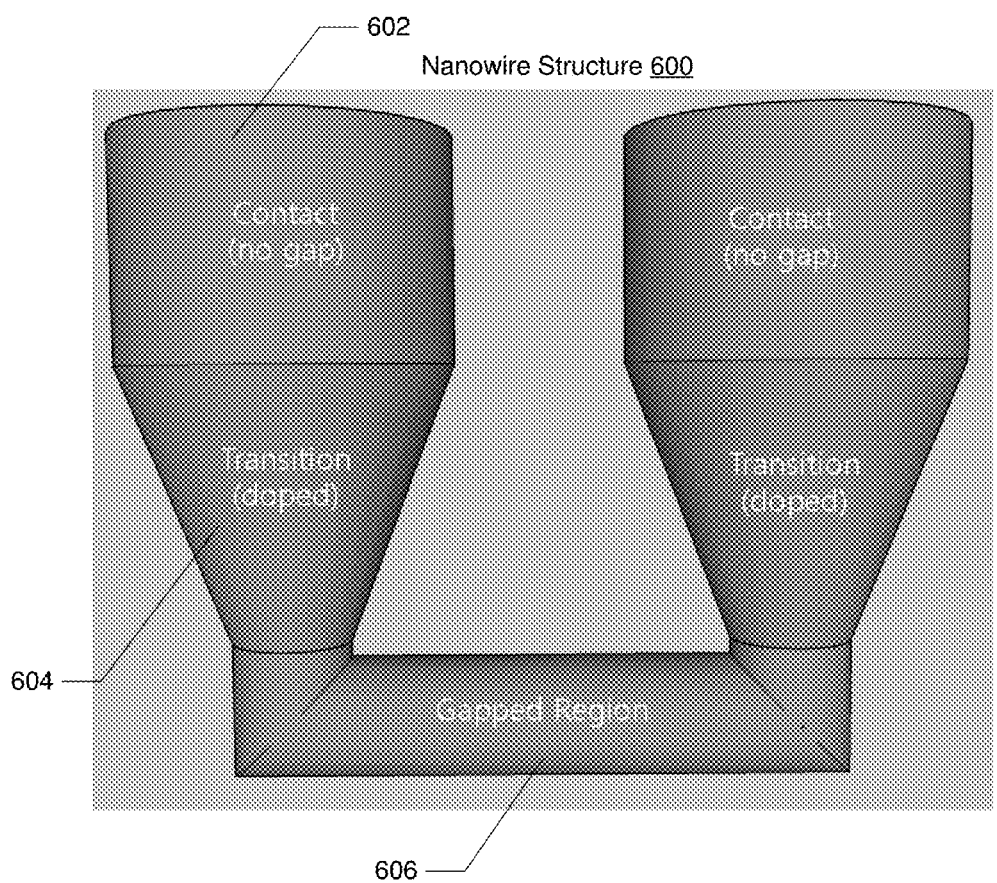
FIG. 6 is a diagram illustrating a nanowire structure comprising a semi-metal material.

In one embodiment, the current transport direction can change within the structure, for specific implementations and process flows chosen. For example, FIG. 6 is a diagram illustrating a nanowire structure 600 comprising a semi-metal material in bulk form having two contact regions 602 adjacent to respective transition regions 604 on either side of a semiconducting or gapped region 606, where the contact region 602, the transition region 604 and the gapped region have substantially a circular cross-section. The nanowire structure induces a gap in the gapped region by reducing the radius of the nanowire. Wide contact regions 602 (gapless state) are at the top of the nanowire structure 600. A smooth reduction in diameter of the nanowire (transition, doped material) in this example corresponds to transition regions 604 in which current transport is vertical and switching to horizontal. The channel/gated region 606 has current transport ion the horizontal direction. A cross section of the structure normal to direction of current flow may have different shapes depending on specific implementation and process flow. For example, in another embodiment the contact and transition regions 602 and 604 may have a substantially circular cross section while the gapped region 606 may have rectangular cross section.

The exemplary embodiments enjoy the following advantages over compositional grading from channel to source/drain: One advantage is that conventional grading by composition is restricted to only those systems where one can alloy from one material to another. For example, while one can grade from InGaAs to InAs via changing the relative In and Ga concentrations, one cannot smoothly alloy from for example Ge to InAs because there is no stable InGeAs alloy over the required range of composition. In the present invention, substantially the same material is used from a substantially gapless state at contact with a metal to a semiconductor, by gradually changing the dimensions and opening the gap by confinement, so that there is no need for a compatible alloy. In some implementations of the present invention, the same material can be used from source to channel to drain and so there is no need for a compatible alloy. In the latter case, candidate semi-metal materials and exemplary embodiments may include any material with a gap that is zero or nearly zero in bulk and effective masses at the band edges that are sufficiently small so that a suitable gap can be opened by confinement at technologically relevant dimensions, for example, on the order of 1 to 100 nm. The exemplary embodiments may also include high doping of the semi-metal material in the transition regions having gradually changing dimensions of the semi- (e.g., in the source/drain and source/drain extensions for MOS devices). Therefore one additional constraint on the semi-metal material is that it must be able to be highly doped.

Another advantage is that it is expected that the contact resistance between a semi-metal and a metal in the present invention to be much smaller than for conventional semiconductor-metal interfaces where the semiconductor has a reasonably large gap (e.g. >100 meV).

Finally, conventional grading by composition can lead to a significant parasitic bipolar (PBP) effect, which in turn will degrade the performance of a device. This can occur anytime the gap in the channel is smaller than the gap in the source/drain. The present invention eliminates this possibility because the gap is larger in the channel than in the source/drain.

A method and system for a confined semi-metal field effect transistor has been disclosed. The present invention has been described in accordance with the embodiments shown, and there could be variations to the embodiments, and any variations would be within the spirit and scope of the present invention. Accordingly, many modifications may be made by one of ordinary skill in the art without departing from the spirit and scope of the appended claims.

We claim:

1. A semi-metal transistor, comprising:
   a semi-metal contact region adjacent to a metal contact;
   at least one semiconductor terminal; and
   a semi-metal transition region connected between the semi-metal contact region and the at least one semiconductor terminal, wherein the semi-metal transition region transitions from a substantially zero gap semi-metal beginning at an interface of the semi-metal contact region and the semi-metal transition region into a semiconductor with an energy band gap towards the at least one semiconductor terminal.

2. The semi-metal transistor of claim 1, wherein dimensions of the semi-metal contact region between the metal contact and the semi-metal transition region are configured such that there is no significant confinement for the semi-metal contact region so that the band gap is substantially zero at an interface of the semi-mental contact region and the mental contact, such that substantially no Schottky Barrier is formed.

3. The semi-metal transistor of claim 1, wherein dimensions of the semi-metal transition region gradually reduce in width starting from the interface with the semi-metal contact region towards the at least one semiconductor terminal to open a gap by confinement.

4. The semi-metal transistor of claim 3, wherein the dimensions of the semi-metal transition region gradually reduce in both height and width starting from the interface with the semi-metal contact region towards the at least one semiconductor terminal.

5. The semi-metal transistor of claim 3, wherein a smooth compositional gradient is used in combination with the gradual reduction in dimensions of the semi-metal transition region to change the band gap from substantially zero to a band gap greater than zero at the semiconductor.

6. The semi-metal transistor of claim 1, wherein the semi-metal transition region comprises a compositional gradient to aid transition from the substantially zero gap semi-metal starting at the interface with the semi-metal contact region to the semiconductor with the energy band gap towards the at least one semiconductor terminal.

7. The semi-metal transistor of claim 6, wherein the semi-metal transition region is highly doped.

8. The semi-metal transistor of claim 7, wherein highly doped comprises doping levels greater than $2 \times 10^{19}$ cm$^{-3}$.

9. The semi-metal transistor of claim 1, wherein the semi-metal transistor comprises a semi-metal material that has a band gap of less than 150 meV in bulk form.

10. The semi-metal transistor of claim 9, wherein the semi-metal material is used for a channel, source/drain terminals, and source/drain transition regions of the semi-metal transistor.

11. The semi-metal transistor of claim 9, wherein the semi-metal material is configured as at least one of a planar transistor, a FinFET, a nanowire, a nanosheet and a stacked nanosheet transistor.

12. The semi-metal transistor of claim 11, wherein the semi-metal material is configured as a nanowire transistor having a substantially a circular cross-section, and wherein the energy band gap is induced by gradually confining the radius of the nanowire in the semi-metal transition region.

13. A method of providing a semi-metal transistor, comprising:
    placing a semi-metal contact region adjacent to a metal contact; and
    connecting a semi-metal transition region between the semi-metal contact region and a semiconductor terminal, wherein the semi-metal transition region transitions from a substantially zero gap semi-metal beginning at an interface of the seim-metal contact region and the semi-metal transition region into a semiconductor with an energy band gap towards the semiconductor terminal.

14. The method of claim 13, configuring dimensions of the semi-metal contact region between the metal contact and the semi-metal transition region such that there is no significant confinement for the semi-metal so that the band gap is substantially zero at an interface of the semi-metal contact region and the mental contact, such that substantially no Schottky Barrier is formed.

15. The method of claim 13, further comprising gradually reducing dimensions of the semi-metal transition region in width starting from the interface with the semi-mental contact region towards the semi-conductor terminal to open a gap by confinement.

16. The method of claim 15, further comprising gradually reducing dimensions of the semi-metal transition region in both height and width starting from the interface with the semi-metal contact region towards the semiconductor terminal.

17. The method of claim 15, further comprising using a smooth compositional gradient in combination with the gradual reduction in dimensions of the semi-metal transition region to change the band gap from substantially zero to a band gap greater than zero at the semiconductor.

18. The method of claim 13, wherein the semi-metal transition region comprises a compositional gradient to aid transition from the substantially zero gap semi-metal starting at the interface with the semi-metal contact region to the semiconductor with the energy band gap towards the at least one semiconductor terminal.

19. The method of claim 18, further comprising highly doping the semi-metal transition region.

20. The method of claim 19, wherein highly doped comprises doping levels greater than $2 \times 10^{19}$ cm$^{-3}$.

21. The method of claim 13, wherein semi-metal material transistor comprises a semi-metal material that has a band gap of less than 150 meV in bulk form.

22. The method of claim 21, further comprising using the semi-metal material for a channel, source/drain terminals, and source/drain transition regions of semi-metal material transistor.

23. The method of claim 21, further comprising configuring the semi-metal material as at least one of a planar transistor, a FinFET, a nanowire, a nanosheet and a stacked nanosheet transistor.

24. The method of claim 23, further comprising configuring the semi-metal material as a nanowire transistor having a substantially a circular cross-section, and wherein the energy band gap is induced by gradually confining the radius of the nanowire in the semi-metal transition region.

* * * * *